United States Patent [19]

Hill

[11] Patent Number: 4,799,063

[45] Date of Patent: Jan. 17, 1989

[54] METHOD AND APPARATUS FOR ISOLATING FAULTS IN AN ANTENNA SYSTEM

[75] Inventor: Gordon S. Hill, Melbourne, Fla.

[73] Assignee: Grumman Aerospace Corporation, Bethpage, N.Y.

[21] Appl. No.: 95,705

[22] Filed: Sep. 14, 1987

[51] Int. Cl.<sup>4</sup> ............................................. G01R 1/00
[52] U.S. Cl. ..................................... 343/703; 324/525
[58] Field of Search ................ 343/703; 324/513, 515, 324/522, 525–534, 173, 58 B

[56] References Cited

U.S. PATENT DOCUMENTS

| | | | |
|---|---|---|---|
| 3,020,529 | 2/1962 | Turner | 342/172 |
| 3,024,461 | 3/1962 | Hollis, Jr. | 342/172 |
| 3,199,107 | 6/1965 | Mills | 343/17.7 |
| 3,208,066 | 9/1965 | Cordry | 343/17.7 |
| 3,225,295 | 12/1965 | Altman et al. | 325/295 |
| 3,366,883 | 1/1968 | Griffin et al. | 455/115 |
| 3,553,586 | 1/1971 | Cribb | 325/67 |
| 3,594,635 | 7/1971 | Minamii et al. | 324/525 |
| 3,697,876 | 10/1972 | Robbins et al. | 343/17.7 |
| 3,772,700 | 11/1973 | Belli | 343/17.7 |
| 3,842,358 | 10/1974 | Frazier | 455/115 |
| 3,870,957 | 3/1975 | Straw | 455/115 |
| 4,041,395 | 8/1977 | Hill | 325/133 |
| 4,249,258 | 2/1981 | Craven | 455/115 |
| 4,262,246 | 4/1981 | Fujii | 455/115 |
| 4,278,979 | 7/1981 | Pelino | 343/703 |
| 4,329,688 | 5/1982 | Goldie | 343/17.7 |

Primary Examiner—William L. Sikes
Assistant Examiner—Doris J. Johnson
Attorney, Agent, or Firm—Pollock, VandeSande & Priddy

[57] ABSTRACT

To isolate a fault in a radar system, prior art teaches the disassembling of many of the components of the radar system and, by means of trial and error, substituting each component and testing the complete radar system to determine if the substitution was correct. In the present invention, the transmission path of the radar system is divided into a number of sections, with each section being independently connected to an adapter. After a section has been connected to an adapter, a resistive load having an impedance matching that of the antenna is mated to the adapter. Subsequently, a pulse is outputted from the transmitter of the radar system and transmitted along the transmission path. If the transmission path between the transmitter and resistive load is without fault, then the signal reflected from the resistive load and measured by a VSWR meter near the transmitter would be below a predetermined threshold, as the resistive load substantially attenuates the power of the outputted pulse. On the other hand, if a fault does reside within the transmission path, then the power of the reflected signal would be at or above the predetermined threshold. By connecting the adapter to successive sections of the transmission path and by repeating the process of connecting the resistive load to the adapter and sending a pulse to the resistive load, a fault can be easily isolated.

16 Claims, 3 Drawing Sheets

METHOD AND APPARATUS FOR ISOLATING FAULTS IN AN ANTENNA SYSTEM

FIELD OF THE INVENTION

The present invention relates to radar antenna systems and more particularly to a method and an apparatus for isolating faults which may occur at different locations of the system.

BACKGROUND OF THE INVENTION

A radar system usually comprises a transmitter, an antenna and a number of waveguide transmission lines connecting the transmitter to the antenna. Pulses generated by the transmitter propagate through the transmission lines to the antenna for transmission. In the case of a surveillance aircraft such as the Navy E-2C with a TRAC-A rotodome antenna, a rotary coupling is interposed between the transmission lines and the antenna, which rotates. The rotary coupling is able to adapt the stationary transmission lines to the rotating antenna. In such a system, when there ar problems in the transmission path, for example, anywhere between the beginning of the transmission lines and before the antenna, when a pulse is transmitted from the transmitter, the fault in the transmission path would cause a high Voltage Standing Wave Ratio (VSWR) wave to be reflected back to the transmitter. Sensors located near the transmitter would sense the high reflected power and, to save the transmitter from damage caused by the reflected power, cause the radar system to shut down. Some of the most common problems which may occur in the transmission lines include shorts, corrosion and loose couplings.

Present aircraft built-in test equipment is incapable of unambiguously isolating a fault in the transmission path which, for example, may include the transmission lines, the rotary coupling and the antenna, during a high VSWR condition that produces a radar inhibit. The conventional method of isolating the fault in the transmission path includes removing and replacing each of the suspect components, followed by a functional test of the radar system during an actual test flight. Needless to say, this method of fault isolation is extremely time consuming and produces excessive aircraft down time. Moreover, since most of the components are high cost items, by taking these components apart and reassembling them causes possible maintenance induced failures such as the mismating of the components.

BRIEF DESCRIPTION OF THE PRESENT INVENTION

The present invention, by using a set of coolant hoses, adapters and an RF dummy load, is able to overcome the aforementioned problems by precisely locating faults in the transmission path of a radar system. The present invention method includes dividing the transmission path into appropriate sections and connecting an adapter and dummy load to each of the sections. When a problem arises in the transmission path, the dummy load is mated to first the adapter closest to the antenna and then to the adapter closer to the transmitter. An RF pulse is then transmitted toward the antenna. Since the dummy load has an impedance matching that of the antenna, if the portion of the transmission path between the transmitter and the dummy load is without fault, then the pulse would be substantially attenuated and no power would be reflected back to the transmitter. On the other hand, if there is power reflected by a fault back to the transmitter, then the dummy load is removed from the adapter to which it was mated and mated to the next adapter. This process is repeated until the power above a predetermined threshold no longer is reflected back to the transmitter. At this point the fault is deemed to be located in the section of the transmission path between the most recently connected section and the transmitter or, in the case of the radiating antenna elements, by exception.

A second embodiment of the present invention uses only one adapter, which is connected to one section at a time. After a pulse is transmitted and possibly reflected by a faulty section, the adapter is removed from the section and connected to the next section and mated with the dummy load. Again, a pulse is transmitted thereto and its reflection is measured. As before, a fault is deemed to be isolated in a particular section when reflected power and no substantial reflected power are measured from the opposite ends of the section.

Therefore, by utilizing the present invention, there is no longer the need to remove and replace each of the components by means of trial and error. Moreover, the down time of the aircraft is substantially reduced since there is no longer any need to test fly the aircraft each time a component has been substituted. This, in turn, means substantial economic savings.

The above-mentioned objects and advantages of the present invention will be more clearly understood when considered in conjunction with the accompanying drawings, in which:

DETAILED DESCRIPTION OF THE INVENTION

Figures 1, 2:
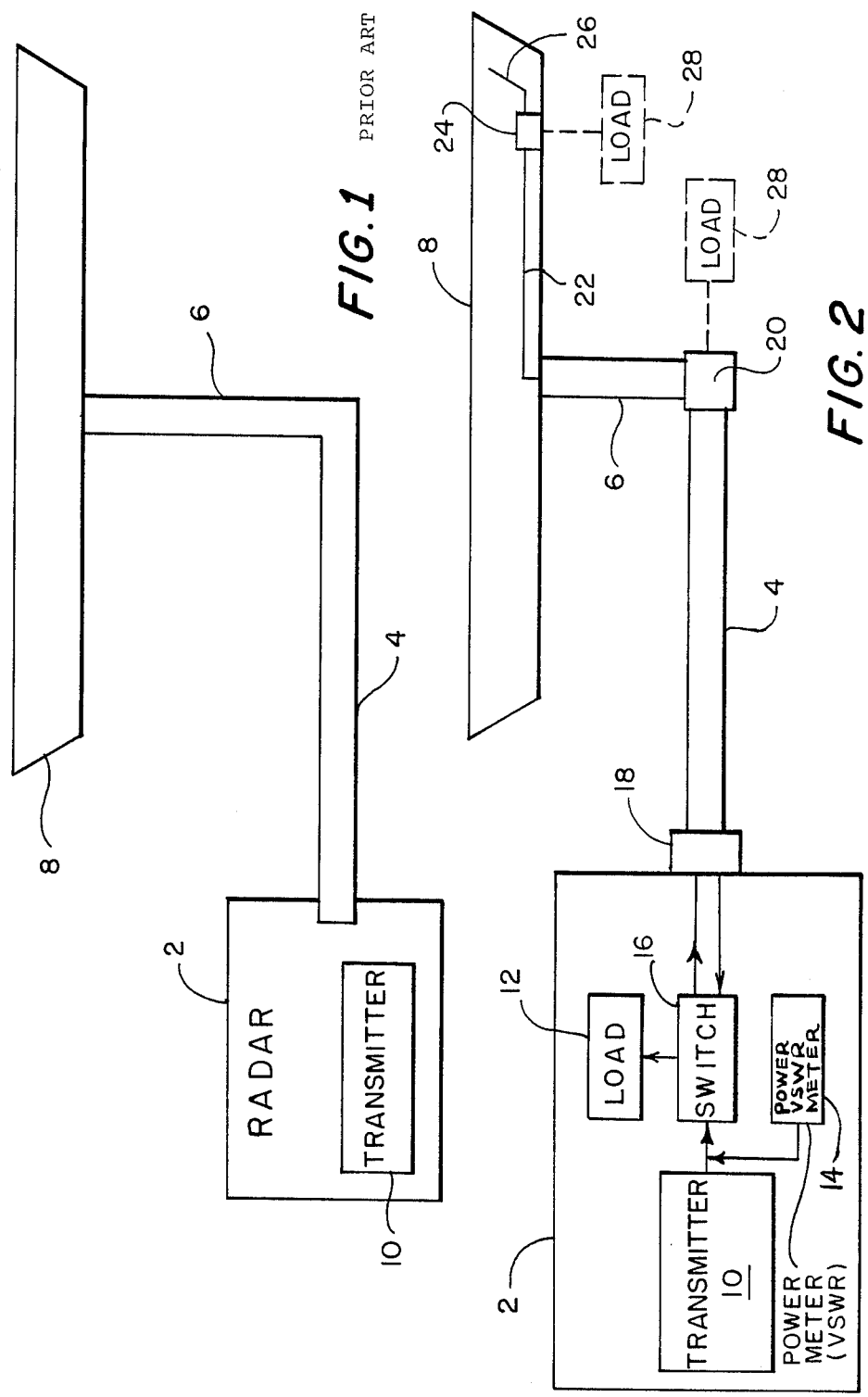
FIG. 1 is a simplified block diagram of a conventional radar system.
FIG. 2 is a semi-block diagram of the present invention radar system.

A conventional radar system which includes a transmitting unit 2, waveguide transmission lines 4, a rotary coupling 6 and an antenna 8 is shown in FIG. 1. This type of radar system is typical and has been incorporated, for example, in the Navy E-2C surveillance aircraft. The radar system is made by the General Electric Company and includes a coaxitron, which is the amplifying tube for transmitting RF pulses to the antenna. Antenna 8 is a radome and antenna which is made by the Randtron Company. It, by rotating, is able to survey a large area. The construction of both the transmitting unit and the radome and antenna are typical and thus, but for essential operation to be discussed later, will not be described herein.

Connecting antenna 8 to transmitting unit 2 are a rotary coupling 6 and waveguide transmission lines 4. Rotary coupling 6 is needed to permit rotation of the antenna, or more specifically, the radiating elements within the antenna, to be discussed later. It should be appreciated that, like the transmitting unit and the radome and antenna, both transmission lines 4 and rotary coupling 6 are conventional and are typical radar components.

In operation, transmitter 10 sends out an RF pulse, the echo of which is to be received and analyzed, to antenna 8 by means of transmission lines 4 and rotary coupling 6. If the radar system is functioning properly, essentially all of the power of the pulse will be accepted by the antenna and radiated outward. Hence, only a very low level signal, representing the reflection of the pulse, will be received at the transmitter. As long as the level of power of the reflected signal remains below a predetermined threshold, the radar system would continue to operate. But if faults, for example, such as shorts or loose coupling occur somewhere in the transmission path between the antenna and the transmitting unit, the power of the pulse being reflected back to the transmitter would be above the previously mentioned predetermined threshold. If the radar system is not shut down, the reflected power would cause substantial damage to the transmitter, not to mention the possible damages it may cause the components supporting the transmitter. Accordingly, the radar system automatically shuts down when a higher than normal reflected power is sensed.

Before the present invention, to locate the whereabouts of a fault in such a radar system, technicians need to disassemble the transmission path and substitute each component with a new one. Such substitution, needless to say, is quite expensive. Moreover, a substantial down time for the aircraft is involved.

Referring now to FIG. 2, there is shown a radar system equipped with the apparatus of the present invention. Designating the same components with the same numbers, the thus equipped radar system is shown to further include a dummy load 12, a VSWR power meter 14 and a switch 16 in transmitting unit 2. For fault isolation purposes, during system test, interposed between transmitting unit 2 and waveguide transmission lines 4 is an adapter 18 to which a dummy load can be mated. A second adapter 20 is inserted at the end of transmission lines 4 and the base of rotary coupling 6. Pulses transmitted from transmitter 10 are fed to the antenna by means of wave guide 4, rotary joint 6 and summation line(s) 22. The summation line is connected to the dummy load via yet a third adapter 24, the radiating elements of the antenna being designated 26.

It should be appreciated that, albeit three adapters are shown for the FIG. 2 radar system, the number of adapters could vary, insofar as the present invention is applicable to different types of transmitting systems including non-radar systems, i.e. radio stations.

Further, it should also be appreciated that only one adapter may be needed if the same adapter is used for each of the designated locations in the transmission path. The method of operation for the one adapter would essentially be the same as that of using multiple adapters, the main difference being that the adapter has to be connectd to and disconnected from each of the designated locations.

As was mentioned previously, transmitting unit 2 of the FIG. 2 radar system further includes a dummy load 12, a VSWR power meter 14 and a switch 16. The dummy load is an attenuator that would capture the energy outputted from transmitter 10 and converts this RF energy into heat. Meter 14, in the meantime, is used to detect and measure the amount of energy of the signals reflected back toward the transmitter, which signals correspond to pulses outputted therefrom.

Switch 16 has the function of directing the pulse outputted from transmitter 10 fo either dummy load 12 or antenna 8. To test whether the transmitter is functioning properly, switch 16, if so set, can redirect a pulse outputted from transmitter 10 to dummy load 12. If transmitter 10 is operating properly, no high reflective power would be received by meter 14. With the transmitter working properly, RF pulses may be outputted therefrom and transmitted to radiating elements 26 of antenna 8. As long as there is no fault in the transmission path, the reflective power detected by meter 14 would be below a predetermined threshold.

However, if a fault does develop somewhere along the transmission line, the reflective power measured by meter 14 would be above the predetermined threshold. Assume, for this embodiment, that the transmission lines are continuous from adapter 18 to adapter 20 and that rotary coupling 6 is a one piece unit extending from the base of antenna 8 to adapter 20. Further assume, for the moment, a short having developed somewhere along rotary coupling 6 and summation line 22. To isolate this fault, the present invention method operates as follows.

A resistive load 28, which is identical to dummy load 12 and which has an impedance matching that of antenna 8, is first mated, for example, with adapter 24 at the base of radiating elements 26. Next, an RF pulse is outputted from transmitter 10 toward the radiating elements of antenna 8. Since load 28 is mated with adapter 24, it acts to intercept and attenuate the power of the outputted pulse, provided that there is no fault developed in the transmission path between the transmitter and adapter 24. Since the fault was assumed to reside within the section of the transmission path defined by rotary coupling 6 and summation line 22, the pulse, instead of being substantially attenuated by load 28, is reflected back to transmitting unit 2 and measured by power meter 14. From this measurement, technicians can easily tell, in all likelihood, that the fault lies somewhere between adapters 24 and 18. This assumes, of course, that the transmitter had earlier been tested and directed into the dummy load 12 to insure that it is functional.

Resistive load 28 is subsequently removed from adapter 24 and mated with adapter 20. Again, a pulse is outputted from transmitter 10 and sent toward antenna 8. Since there is nothing wrong with transmission lines 4 and since load 28 is now intercepting the pulse at the base of rotary coupling 6, the power of the pulse is substantially attenuated by load 28 and only a very low reflective signal is received from a meter 14. From this reading, it can be ascertained that transmission lines 4 are functional and the fault lies somewhere between adapters 20 and 24. Assuming that there is no adapter connected at the base of antenna 8 and the top of rotary coupling 6, both rotary coupling 6 and summation line 22 need to be replaced. Of course, if there was an adapter integrated between rotary coupling 6 and summation line 22, then the above-mentioned process may be repeated once again so that the fault may be further isolated.

Using the same principle, a fault lying in radiating elements 26 of antenna 8 or switch 16 of transmitting unit 2 can likewise easily be isolated by direct fault isolation or exception.

Figure 3:
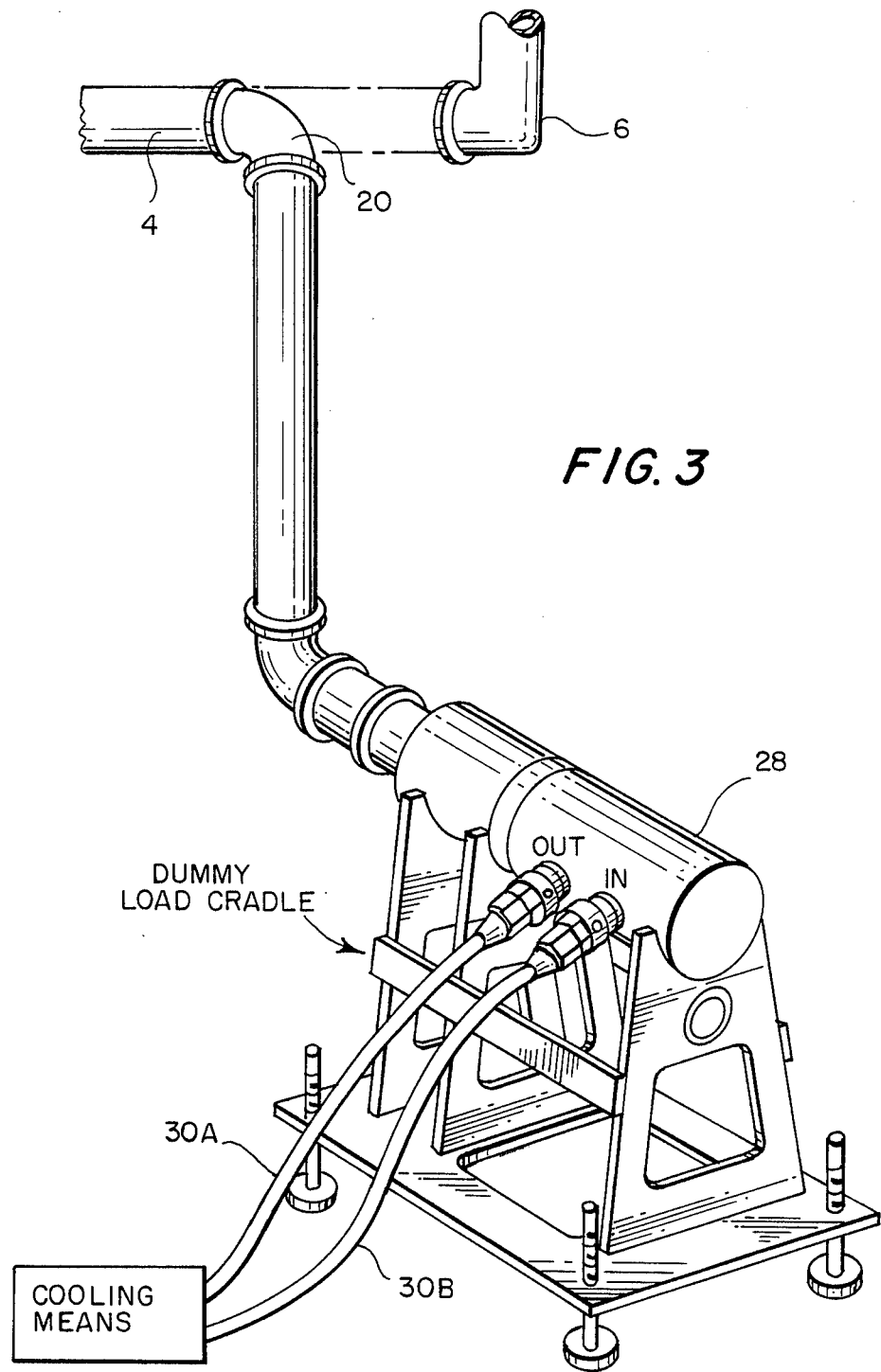
FIG. 3 is an isometric drawing showing the dummy load of the present invention connected to a waveguide transmission line.
Figure 4:
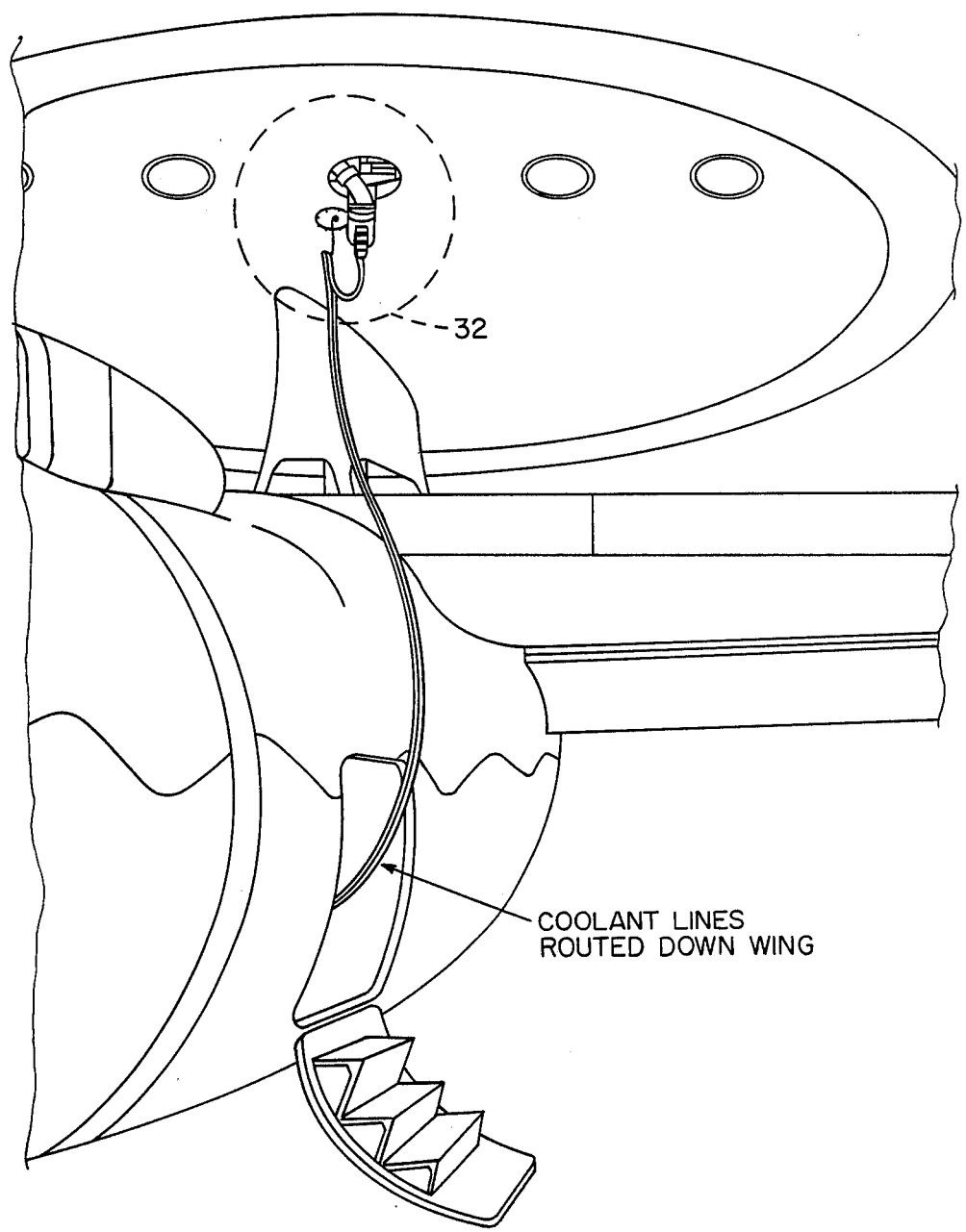
FIG. 4 is a drawing showing the dummy load being connected to the base of the radiating elements of the antenna.

Referring to FIG. 3, there is shown a schematic view of resistive dummy load 28 being connected to adapter 20, which in turn is connected to transmission lines 4. To maintain resistive load 28 in an acceptable temperature, a pair of hoses 30a and 30b circulate coolant therein. The coolant is circulated by means of a pump (not shown) and the heat carried by the coolant may be dissipated by means of a heat exchanger, also not shown. It should be appreciated that adapter 20 may be an existing waveguide elbow. Similarly, resistive load 28 is comprised of an attenuator, which is also quite conventional. The connection of a resistive load to the base of radiating elements 26 is shown in FIG. 4, illustrated particularly within circle 32.

Inasmuch as the present invention is subject to many variations, modifications, and changes in detail, it is intended that all matter described throughout this specification as shown in the accompanying drawings be interpreted as illustrative only and not in a limiting sense. Accordingly, it is intended that the invention be limited only by the spirit and scope of the appended claims.

I claim:

1. In a transmitting system having a transmitting means, waveguide transmission lines, an antenna having a given impedance and coupling means, the transmission lines and coupling means connecting the transmitting means to the antenna, a method of isolating faults in the system comprising the steps of:
    (a) dividing the transmission lines and the coupling means into at least two sections;
    (b) connecting an adapter means to one of the sections;
    (c) mating a resistive load having an impedance substantially matching that of the antenna to the adapter means for intercepting and attenuating pulses sent from the transmitting means;
    (d) sending a pulse from the transmitting means towards the resistive load;
    (e) designating the path between the transmitting means and the adapter means as faultless if the sent pulse is substantially attenuated by the resistive load and not reflected back to the transmitting means; and
    (f) designating the path between the transmitting means and the adapter means as faulty if the sent pulse is substantially reflected back to the transmitting means.

2. The method as set forth in claim 1, further comprising the steps of:
    (g) connecting the adapter means to another section;
    (h) mating the resistive load to the adapter means; and
    (i) repeating steps (d) to (f);
    (j) identifying a section of the system as faulty when that section contains a designated faulty path and is adjacent to another section containing a designated faultless path.

3. The method as set forth in claim 2, further comprising the steps of:
    (k) repeating steps (d) to (h) until the resistive load had been mated to each of the sections.

4. The method as set forth in claim 1, wherein step (c) includes mating the resistive load to an adapter means connected to the input of the radiating elements of the antenna; and wherein the method further comprises the step of:
    identifying the antenna as faulty when a pulse sent from the transmitting means is not substantially reflected by the resistive load.

5. The method as set forth in claim 1, wherein step (c) includes mating the resistive load to an adapter means connected immediately aft of the transmitting means, the transmitting means including a pulse transmitter and supporting elements; and wherein the method further comprises the step of:
    identifying at least one element of the transmitting means as non-functional when a pulse sent from the pulse transmitter is not substantialy attenuated by the resistive load.

6. In a transmitting system having a transmitting means, transmission lines and an antenna having a particular impedance, the transmission lines connecting the transmitting means to the antenna, a method of isolating faults in the system comprising the steps of:
    (a) dividing the transmission lines into at least 2 sections;
    (b) connecting respective adapter means to each one of the sections;
    (c) mating a resistive load having an impedance substantially matching that of the antenna to one of the adapter means;
    (d) sending a pulse from the transmitting means towards the resistive load;
    (e) receiving a signal reflected from the resistive load;
    (f) designating the portion of the transmission lines between the transmitting means and the resistive load as faultless if the power of the reflected signal is below a predetermined threshold and designating the portion as faulty if the power of the reflected signal corresponds at least to the threshold.

7. The method as set forth in claim 6, further comprising the steps of:
    (g) mating the resistive load to another adapter means;
    (h) repeating steps (d) to (g);
    (i) identifying the system as without fault if the resistive load had been mated to all the sections and no faulty portion has been designated.

8. The method as set forth in claim 6, further comprising the steps of:
    (g) mating the resistive load to another adapter means;
    (j) repeating steps (d) to (g);
    (k) identifying a section of the transmission lines as faulty when that section contains a designated faulty portion and is adjacent to a designated faultless portion.

9. The method as set forth in claim 6, wherein the step (c) includes mating the resistive load to an adapter means connected to the input of radiating elements of the antenna; and wherein the method further comprises the step of:
    identifying the antenna as faulty when the power of the signal reflected from the resistive load is below the predetermined threshold.

10. The method as set forth in claim 6, wherein the step (c) includes mating the resistive load to an adapter means connected immediately aft of the transmitting means, the transmitting means including a transmitter and supporting components; and wherein the method further comprises the step of:
    identifying at least one of the components as non-functional when the power of the signal reflected from the resistive load at least corresponds to the predetermined threshold.

11. In a transmitting system having a transmitting means, transmission lines, an antenna having a given impedance and coupling means, the transmitting lines and the coupling means connecting the transmitting means and the antenna, apparatus for isolating faults in the system comprising:
- at least one adapter means connectable to a section of the transmission lines and the coupling means;
- a resistive load having an impedance matching that of the antenna connectable to the adapter means for intercepting and attenuating a pulse sent from the transmitting means;
- means working cooperatively with the transmitting means for measuring the power of a signal, corresponding to the pulse, reflected by the resistive load through a portion of the system separating the transmitting means and the resistive load;
- whereby the portion of the system between the resistive load and the transmitting means is designated as faultless if the power of the reflected signal has been substantially attenuated by the resistive load, the portion otherwise designated as faulty if the reflected signal has not been substantially attenuated.

12. The apparatus according to claim 11, wherein the resistive load comprises an RF dummy load.

13. The apparatus according to claim 11, wherein the measuring means comprises a VSWR power meter.

14. The apparatus according to claim 11, wherein the adapter means is coupled to the base of radiating elements of the antenna for mating with the resistive load; and
wherein the antenna is identified as faulty if the power of the signal reflected by the resistive load at the base of the radiating elements is substantially attenuated.

15. The apparatus according to claim 11, wherein the adapter means is coupled immediately aft of the transmitting means for mating with the resistive load, the transmitting means including a transmitter and supporting components; and
wherein at least one of the components is identified as faulty if the power of the signal reflected by the resistive load aft of the transmitting means is not substantially attenuated.

16. The apparatus according to claim 11, further comprising:
cooling means for absorbing the heat generated by the resistive load.

* * * * *